United States Patent [19]

Nakayama et al.

[11] Patent Number: 5,231,353

[45] Date of Patent: Jul. 27, 1993

[54] APPARATUS FOR DETECTING A FINE MAGNETIC FIELD WITH A SIGNAL ADJUSTING CIRCUIT IN A DC SQUID

[75] Inventors: Satoshi Nakayama; Nobuhiro Shimizu; Akikazu Odawara, all of Tokyo, Japan

[73] Assignee: Seiko Instruments Inc., Japan

[21] Appl. No.: 839,183

[22] Filed: Feb. 21, 1992

[30] Foreign Application Priority Data

Feb. 22, 1991 [JP] Japan .................................. 3-028804

[51] Int. Cl.⁵ ..................... G01R 33/02; G01R 35/00; G01R 33/035
[52] U.S. Cl. ..................................... 324/248; 324/202; 505/846
[58] Field of Search ............. 324/248, 225, 202; 505/845, 846

[56] References Cited

U.S. PATENT DOCUMENTS 4,389,612 6/1983 Simmonds et al. ................: 324/248

Primary Examiner—Walter E. Snow
Attorney, Agent, or Firm—Bruce L. Adams; Van C. Wilks

[57] ABSTRACT

A DC superconducting quantum interference device has a superconductive ring and a feedback modulation coil for detecting a magnetic field. A variable bias current is applied to the superconductive ring and a modulating signal is applied to the feedback modulation coil. A signal change-over circuit is provided for superposing a false signal on the modulating signal, the false signal electrically simulating the effect of an applied magnetic field to enable adjustment of the variable bias current and the modulating signal under measurement conditions. A flux locked loop circuit of the DC superconducting quantum interference device has an external input terminal or a low-frequency oscillator for supplying a low-frequency signal to the signal change-over circuit which is superposed on the modulating signal applied to the feedback modulation coil. In this manner, the conditions for adjustment and measurement are not changed thereby facilitating the adjustment so that the DC superconductive quantum interference device effectively offsets a disturbing magnetic field.

21 Claims, 3 Drawing Sheets

APPARATUS FOR DETECTING A FINE MAGNETIC FIELD WITH A SIGNAL ADJUSTING CIRCUIT IN A DC SQUID

BACKGROUND OF THE INVENTION

The present invention relates to a highly sensitive magnetic field detecting device using a DC Superconducting quantum interference device (i.e., DC SQUID, which can be used for medical or underground resource searching applications.

FIG. 4 is a block diagram showing the structure of a highly sensitive magnetic field detecting device of the prior art. A reference signal outputted from an oscillator 5 is adjusted by an amplitude adjustor 9 and is converted into an electric current by a first voltage-current converter 6 and is applied as a modulating signal to a DC SQUID 1. When a suitable bias current is fed to the DC SQUID 1 from a variable current source 8, a magnetic flux interlinking the DC SQUID 1 is modulated by the modulating signal and is detected as a modulated signal. This modulated signal is amplified by an amplifier 2 and is detected by a phase detector 3 using the reference signal coming from the oscillator 5. A detected signal corresponding to the output of that phase detector 3 is outputted from an integration circuit 4 and is converted into an electric current by a second voltage-current converter 7. The electric current is applied as such a feedback signal to the DC SQUID 1 so as to compensate a change in the magnetic flux interlinking the DC SQUID 1.

These circuits for driving the DC SQUID 1 are called the "F.L.L. (Flux Locked Loop) circuit device". The magnetic field can be measured by reading out the feedback signal or detected signal. The measurement of a fine magnetic field is performed under a magnetically shielded special circumstance so as to eliminate only disturbing magnetic field. In the prior art, the adjustments of the variable current source 8 and the amplitude adjustor 9 for the measurements described above are accomplished under the circumstance having the disturbing magnetic field or by using a magnetic element such as a magnet to apply noise to the DC SQUID 1 while observing the amplitude of the output coming from the amplifier 2 while being synchronized with the reference signal and the output of the phase detector 3.

Thus, according to the highly sensitive magnetic field detecting device of the prior art, the adjustments of the variable current source 8 and the amplitude adjustor 9 have to be accomplished under a circumstance different from that for the measurements. As a result, measurements under a different circumstance may deviate from those in an optimum state even with an optimum adjustment. If, on the other hand, the DC SQUID 1 used is exemplified by a plane type gradiometer which offsets the influence of the under circumstances other than the special one that is shielded magnetically, there arises a problem in that the signal hardly changes even with disturbances so that the optimum adjustment cannot be achieved.

SUMMARY OF THE INVENTION

It is an object of the present invention to provide a magnetic field detecting device with an optimum adjusting capability.

In order to achieve the object, the F.L.L circuit device of the highly sensitive magnetic field detecting device is partially equipped with a signal change-over circuit enabled to superpose a false signal or a reference signal for adjusting a bias current modulating signal on a signal inputted to a feedback modulating coil. At least either an external input terminal is provided connected with the signal change-over circuit and adapted to receive the false signal from the outside or a low-frequency oscillator is provided for generating the false signal.

According to the above-specified structure, the disturbing magnetic field to be applied to the DC SQUID 1 at the time of adjusting the bias current or the modulating signal can be applied not from the outside of the DC SQUID 1 but from the feedback modulating coil using the false signal applied from the signal change-over circuit.

DETAILED DESCRIPTION OF THE PREFERRED EMBODIMENTS

Figure 1:
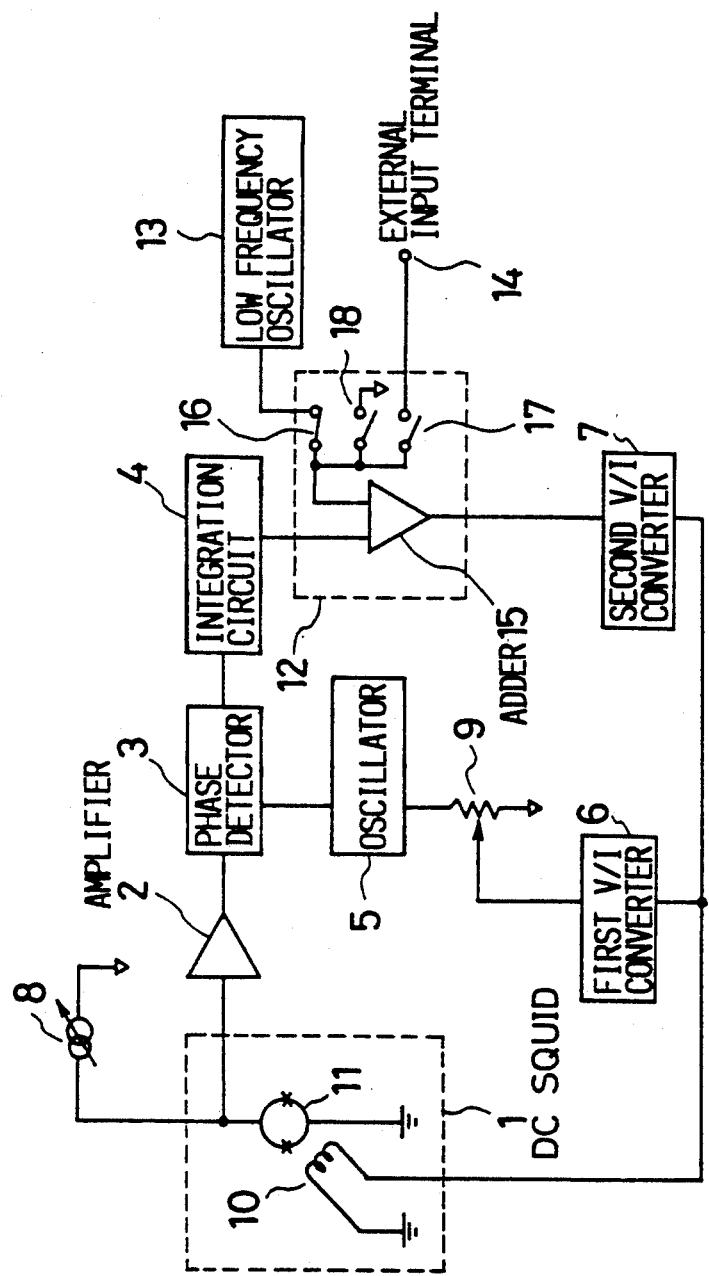
FIG. 1 is a block diagram showing the structure of a first embodiment of the highly sensitive magnetic field detecting device according to the present invention.

The present invention will be described in the following in connection with the embodiments thereof with reference to the accompanying drawings. FIG. 1 is a block diagram showing the structure of a highly sensitive magnetic field detecting device according to a first embodiment of the present invention. In FIG. 1, a DC SQUID 1 is constructed of a feedback modulating coil 10 and a DC SQUID ring 11, which are magnetically coupled to each other. The feedback modulating coil 10 is connected with the outputs of a first voltage-current converter 6 and a second voltage-current converter 7, and the DC SQUID ring 11 is connected with the input of an amplifier 2 and the output of variable current applying means, or a variable current source 8.

An oscillator 5 is connected with the inputs of a phase detector 3 and amplitude adjusting means, or an amplitude adjustor 9, the output of which is connected with the input of the first voltage-current converter 6. The phase detector 3 has its inputs connected separately with the output of the amplifier 2 and the oscillator 5 and its output connected with an integration circuit 4. A signal change-over circuit 12 is composed of an adder 15, a first switch 16, a second switch 17 and a third switch 18. One input of the adder 15 is connected commonly with the one-side terminals of the first switch 16, the second switch 17 and the third switch 18. The other input of the adder 15 is connected with the output of the integration circuit 4, and the output of the same is connected with the input of the second voltage-current converter 7. The other terminal of the first switch 16 is connected with a low-frequency oscillator 13, and the other terminal of the second switch 17 is connected with an external input terminal 14, and the other terminal of the third switch 18 is connected with the ground.

With the structure thus far described, the adjusting operations using the low-frequency oscillator 13 will be described in the following.

When the first switch 16 is closed whereas the second switch 17 and the third switch 18 are opened to bring the integration circuit 4 into a reset state having an output O, the low-frequency signal from the low-frequency oscillator 13 is fed through the adder 15 as a false voltage signal and is converted into the electric current by the second voltage-current converter 7 and is inputted to the feedback modulating coil 10. This low-frequency signal is converted by the feedback modulating coil 10 into the magnetic flux interlinking the DC SQUID loop 11 so that the DC SQUID 1 experiences the same effect as that of the time when the disturbing magnetic field is applied to the DC SQUID 1. In this state, the variable current source 8 and the amplitude adjustor 9 are so adjusted that the amplitude of the output signal of the amplifier 2 or the output signal of the phase detector 3 may have the maximum amplitude while being observed through an oscilloscope or the like. Then, it is possible to optimize the bias current to be fed to the DC SQUID ring 11 and the modulating signal to be fed to the feedback modulating coil 10.

The measurements of a magnetic field are performed by opening the first switch 16 and the second switch 17 and closing the third switch 18 to release the integration circuit 4 from its reset state. The operations at the time of measuring of the magnetic field are wholly similar to those of the example of the prior art excepting that the output of the integration circuit 4 is transmitted through the signal change-over circuit 12 to the second voltage-current converter 7.

Moreover, the operations at the adjusting time using the external input terminal 14 are also similar to the aforementioned ones excepting that the first switch 16 is opened at first whereas the second switch 17 is closed to input the low-frequency signal from the outside through the external input terminal 14 to the adder 15.

Figure 2:
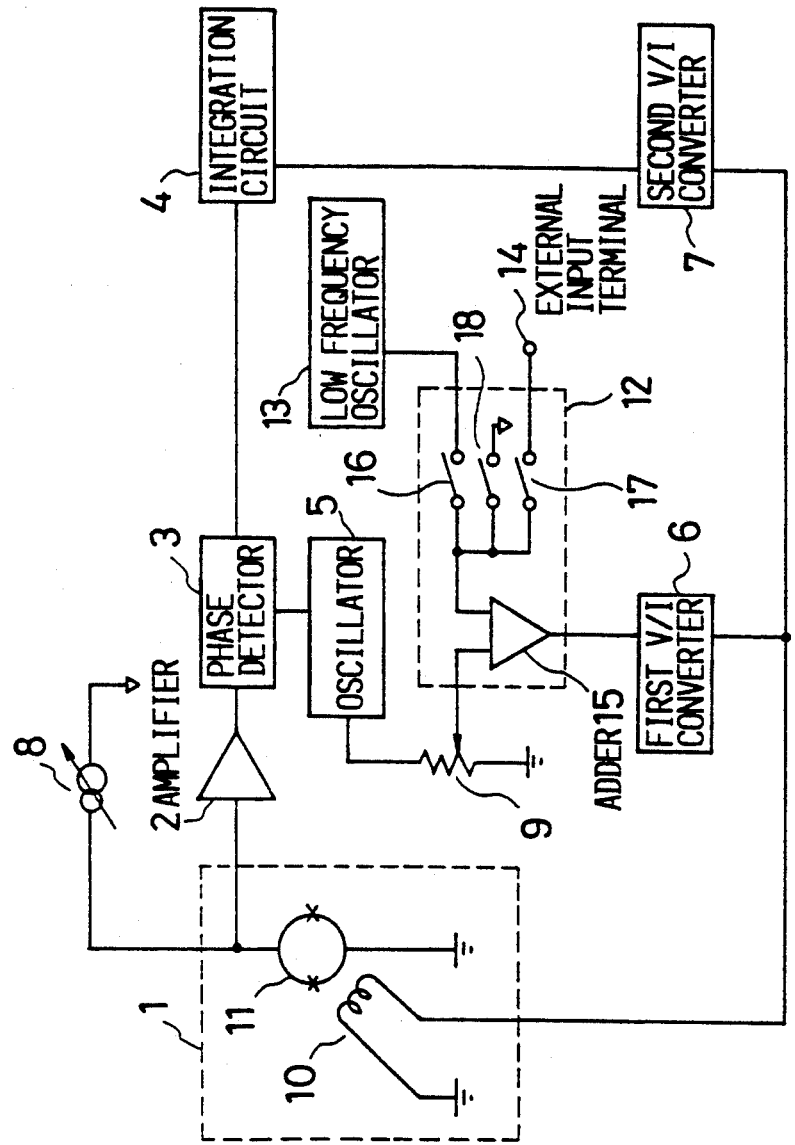
FIG. 2 is a block diagram showing the structure of a second embodiment of the highly sensitive magnetic field detecting device according to the present invention.

FIG. 2 is a block diagram showing the structure of a highly sensitive magnetic field detecting device according to a second embodiment of the present invention. In FIG. 2, a DC SQUID 1 is constructed of a feedback modulating coil 10 and a DC SQUID ring 11, which are magnetically coupled to each other. The feedback modulating coil 10 is connected with the outputs of a first voltage-current converter 6 and a second voltage-current converter 7, and the DC SQUID ring 11 is connected with the input of an amplifier 2 and the output of a variable current source 8.

An oscillator 5 is connected with the inputs of a phase detector 3 and an amplitude adjustor 9, and the phase detector 3 has its inputs connected separately with the output of the amplifier 2 and the oscillator 5 and its output connected with the input of an integration circuit 4. The output of the integrator 4 is connected with the input of the second voltage-current converter 7. A signal change-over circuit 12 is composed of an adder 15, a first switch 16, a second switch 17 and a third switch 18. One input of the adder 15 is connected commonly with the one-side terminals of the first switch 16, the second switch 17 and the third switch 18. The other input of the adder 15 is connected with the amplitude adjustor 9, and the output of the same is connected with the input of the first voltage-current converter 6. The adder 15 adds the false voltage signal to the modulation voltage signal and this added signal is converted to an added false current signal. The other terminal of the first switch 16 is connected with a low-frequency oscillator 13, the other terminal of the second switch 17 is connected with an external input terminal 14, and the other terminal of the third switch 18 is connected with the ground.

With the structure thus far described, the operations are similar to those of the first embodiment shown in FIG. 1, excepting that the low-frequency signal for establishing effects similar to those of the disturbing magnetic field applied to the DC SQUID 1 is added to the modulating signal in the adder 15 and is applied to the feedback modulating coil.

Figure 3:
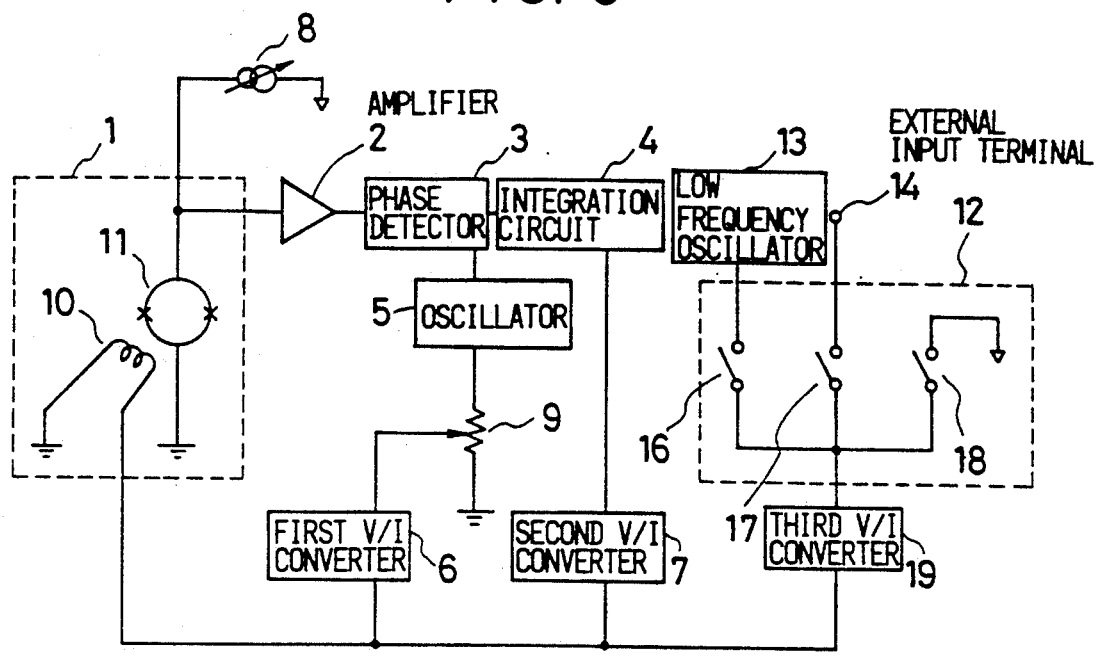
FIG. 3 is a block diagram showing the structure of a third embodiment of the highly sensitive magnetic field detecting device according to the present invention.
Figure 4:
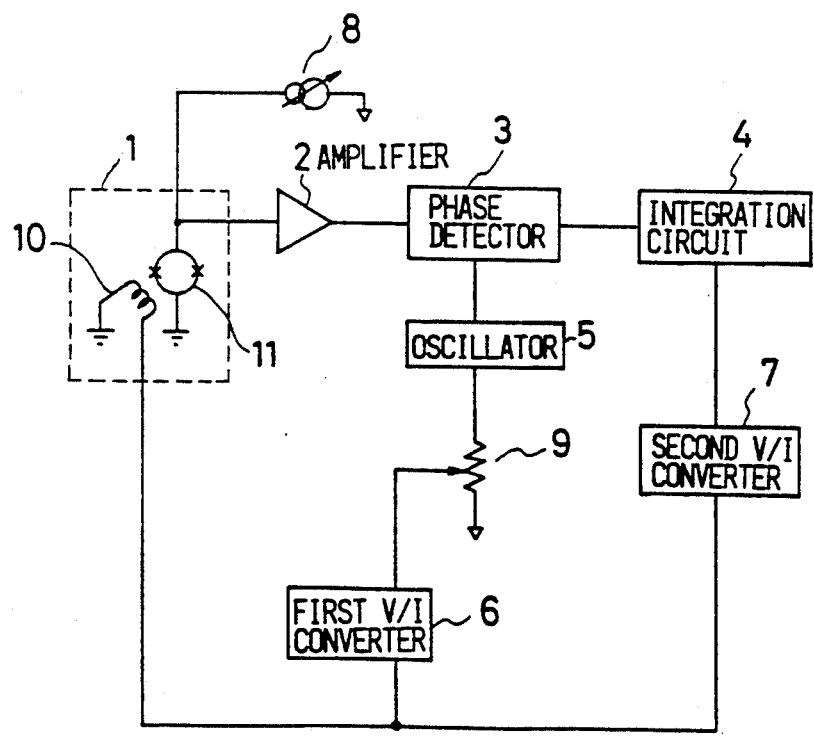
FIG. 4 is a block diagram showing the structure of the highly sensitive magnetic field detecting device of the prior art.

FIG. 3 is a block diagram showing the structure of a highly sensitive magnetic field detecting device according to a third embodiment of the present invention. In FIG. 3, a DC SQUID 1 is constructed of a feedback modulating coil 10 and a DC SQUID ring 11, which are magnetically coupled to each other. The feedback modulating coil 10 is connected with the outputs of a first voltage-current converter 6, a second voltage-current converter 7 and a third voltage-current converter 19, and the DC SQUID ring 11 is connected with the input of an amplifier 2 and the output of a variable current source 8. An oscillator 5 is connected with the inputs of a phase detector 3 and an amplitude adjustor 9, the output of which is connected with the input of the first voltage-current converter 6. The phase detector 3 has its inputs connected separately with the output of the amplifier 2 and the oscillator 5 and its output connected with an integration circuit 4.

The integration circuit 4 has its output connected with the input of the second voltage-current converter 7. A signal change-over circuit 12 is composed of a first switch 16, a second switch 17 and a third switch 18. The one-side terminals of the first switch 16, the second switch 17 and the third switch 18 are connected with the input of the third voltage-current converter 19. The other terminal of the first switch 16 is connected with a low-frequency oscillator 13, the other terminal of the second switch 17 is connected with an external input terminal 14, and the other terminal of the third switch 18 is connected with the ground.

With the structure thus far described, the operations are similar to those of the first embodiment shown in FIG. 1, excepting that the low-frequency signal for establishing effects similar to those of the disturbing magnetic field applied to the DC SQUID 1 is converted into an electric current by the third voltage-current converter 19 and is applied to the feedback modulating coil.

As has been described hereinbefore, according to the present invention, the disturbing magnetic field necessary for the adjustment can be falsely established by making it possible to input the low-frequency signal to the feedback modulating coil. As a result, the bias current and the modulating signal can be adjusted under the same circumstances as those at the adjusting time so that the measurements can be accomplished always in the optimum state. Even if the plane type gradiometer, which offsets the influences of the disturbing magnetic field and operates under circumstances other than the special one shielded magnetically, is used, the low-frequency signal can be superposed on the signal inputted to the feedback modulating coil to apply the adjusting disturbing magnetic field left unoffset so that the optimum adjustment can be accomplished.

What is claimed is:

1. An apparatus for detecting a fine magnetic field, comprising: a DC superconducting quantum interference device, having a pair of Josephson junctions connected in a superconductive ring and a feedback modulation coil coupled to the superconductive ring, for converting a fine magnetic flux to an electric signal; a bias current source coupled to the DC superconducting quantum interference device for supplying biasing current to the superconductive ring; a phase detector coupled to the superconductive ring for demodulating the electric signal outputted from the DC superconducting quantum interference device; an integration circuit coupled to the phase detector for outputting a feedback voltage signal for the feedback modulation coil corresponding to a demodulated signal outputted form the phase detector; an oscillator coupled to the phase detector for supplying a demodulating frequency signal to the phase detector; an amplitude adjustor coupled to the oscillator for adjusting an amplitude of a modulation voltage signal outputted from the oscillator; a first voltage-current converter coupled to the amplitude adjustor and the feedback modulation coil for converting the modulation voltage signal to a modulation current signal applied to the feedback modulation coil; a second voltage-current converter coupled to the integration circuit and the feedback modulation coil for converting the feedback voltage signal to a feedback current signal applied to the feedback modulation coil by adding to the modulation current signal; and a signal change-over circuit coupled to the feedback modulation coil for selectively applying a false signal to the feedback modulation coil during a signal adjusting state for adjusting the demodulation signal outputted from the phase detector.

2. An apparatus for detecting a fine magnetic field according to claim 1; further comprising a low frequency oscillator coupled to the signal changer-over circuit for generating the false signal independent from the oscillator.

3. An apparatus for detecting a fine magnetic field according to claim 1; further comprising an external input terminal coupled to the signal change-over circuit for externally applying the false signal.

4. An apparatus for detecting a fine magnetic field according to claim 1; including means for adding the false signal as a false voltage signal to the feedback voltage signal to produce an added voltage signal which is converted to a current signal by the second voltage-current converter.

5. An apparatus for detecting a fine magnetic field according to claim 1; including means for adding the false signal as a false voltage signal to the modulation voltage signal to produce an added voltage signal which is converted to a current signal by the first voltage-current converter.

6. An apparatus for detecting a fine magnetic field according to claim 1; further comprising a third voltage-current converter coupled to the signal change-over circuit and the feedback modulation coil for converting the false signal to a current signal applied to the feedback modulation coil by adding to the modulation current signal and the feedback current signal.

7. An apparatus for detecting a fine magnetic field, comprising: a DC superconducting quantum interference device, having a superconductive ring and a feedback modulation coil coupled to the superconductive ring, for detecting a magnetic field; variable current applying means for applying a variable bias current to the superconductive ring; amplitude adjusting means for adjusting the amplitude of a modulating signal applied to the feedback modulation coil; and a change-over circuit for superposing a false signal, which simulates the effect of an applied magnetic field, on the modulating signal to enable adjustment of the variable current applying means and the amplitude adjusting means under measurement conditions.

8. An apparatus for detecting a fine magnetic field according to claim 7; including a low frequency oscillator for supplying a low frequency signal to the changer-over circuit; and the change-over circuit includes means for generation the false signal dependent on the low frequency signal.

9. An apparatus for detecting a fine magnetic field according to claim 7; including an external input terminal for inputting an externally supplied low frequency signal to the change-over circuit; and the change-over circuit includes means for generating the false signal dependent on the low frequency signal.

10. An apparatus for detecting a fine magnetic field according to claim 7; wherein the superconductive ring generates a feedback voltage during operation of the DC superconducting quantum interference device; and the change-over circuit includes an adder for adding the false signal to the feedback voltage.

11. An apparatus for detecting a fine magnetic field according to claim 7; wherein the change-over circuit includes an adder for adding the false signal to the modulating signal from the amplitude adjusting means.

12. An apparatus for detecting a fine magnetic field according to claim 7; wherein the amplitude adjusting means includes means for outputting a modulation voltage signal and the change-over circuit includes means for outputting the false signal as a false voltage signal; and further comprising a first voltage-current converter coupled to the amplitude adjusting means for converting the modulation voltage signal to a modulation current signal which is applied as the modulating signal to the feedback modulation coil; and a second voltage-current converter for converting the false voltage signal to a false current signal.

13. An apparatus for detecting a fine magnetic field according to claim 7; wherein the superconductive ring generates a feedback voltage during operation of the DC superconducting quantum interference device; the amplitude adjusting means includes means for outputting a modulation voltage signal; the change-over circuit includes means for outputting the false signal as a false voltage signal; the change-over circuit includes an adder for adding the false voltage signal to the feedback voltage; and further comprising a first voltage-current converter coupled to the amplitude adjusting means for converting the modulation voltage signal to a modulation current signal; a second voltage-current converter for converting the added false voltage signal and feedback voltage to an added false current signal; and means for superposing the modulation current and the added false current signal to constitute the modulating signal applied to the feedback modulation coil.

14. An apparatus for detecting a fine magnetic field according to claim 13; including a low frequency oscillator for inputting a low frequency signal to the change-over circuit; and the change-over circuit includes means for generating the false signal dependent on the low frequency signal.

15. An apparatus for detecting a fine magnetic field according to claim 13; including an external input terminal for inputting an externally supplied low frequency signal to the change-over circuit; and the change-over circuit includes means for generating the false signal dependent on the low frequency signal.

16. An apparatus for detecting a fine magnetic field according to claim 7; wherein the amplitude adjusting means includes means for outputting a modulation voltage signal and the change-over circuit includes means for outputting the false signal as a false voltage signal; the change-over circuit includes an adder for adding the false voltage signal to the modulation voltage signal; the superconductive ring generates a feedback voltage during operation of the DC superconducting quantum interference device; and further comprising a first voltage-current converter coupled to the adder for converting the added false voltage signal and modulation voltage signal to an added false current signal; a second voltage-current converter for converting the feedback voltage to a feedback current signal; and means for superposing the feedback current signal and the added false current signal to constitute the modulating signal applied to the feedback modulation coil.

17. An apparatus for detecting a fine magnetic field according to claim 16; including a low frequency oscillator for supplying a low frequency signal to the change-over circuit; and the change-over circuit includes means for generating the false signal dependent on the low frequency signal.

18. An apparatus for detecting a fine magnetic field according to claim 16; including an external input terminal for inputting an externally supplied low frequency signal to the change-over circuit; and the change-over circuit includes means for generating the false signal dependent on the low frequency signal.

19. An apparatus for detecting a fine magnetic field according to claim 7; wherein the amplitude adjusting means includes means for outputting a modulation voltage signal; the superconductive ring generates a feedback voltage during operation of the DC superconducting quantum interference device; the change-over circuit includes means for outputting the false signal as a false voltage signal; and further comprising a first voltage-current converter coupled to the amplitude adjusting means for converting the modulation voltage signal to a modulation current signal; a second voltage-current converter for converting the feedback voltage to a feedback current signal; a third voltage-current converter for converting the false voltage signal to a false current signal; and means for superposing the modulation current signal, the feedback current signal and the false current signal to constitute the modulating signal applied to the feedback modulation coil.

20. An apparatus for detecting a fine magnetic field according to claim 19; including a low frequency oscillator for supplying a low frequency signal to the change-over circuit; and the change-over circuit includes means for generating the false signal dependent on the low frequency signal.

21. An apparatus for detecting a fine magnetic field according to claim 19; including an external input terminal for supplying an externally supplied low frequency signal to the change-over circuit; and the change-over circuit includes means for generating the false signal dependent on the low frequency signal.

* * * * *